(12) United States Patent
Nakano et al.

(10) Patent No.: US 6,726,491 B2
(45) Date of Patent: Apr. 27, 2004

(54) JACK CONNECTOR RETAINER WITH RECESSES IN VICINITY OF ELECTRICAL TERMINALS AND OPTO-ELECTRICAL JACK CONNECTORS USING SUCH RETAINER

(75) Inventors: Takahiko Nakano, Kashihara (JP); Takashi Takaoka, Kitakatsuragi-gun (JP); Mitsuhisa Ikuta, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/943,611

(22) Filed: Aug. 30, 2001

(65) Prior Publication Data

US 2002/0028601 A1 Mar. 7, 2002

(30) Foreign Application Priority Data

Sep. 5, 2000 (JP) .......................... 2000-268842

(51) Int. Cl.⁷ ............................ H05K 1/100; H01R 4/02
(52) U.S. Cl. ........................................ 439/83; 439/876
(58) Field of Search ............................ 439/83, 876, 567

(56) References Cited

U.S. PATENT DOCUMENTS

| 4,010,992 | A | * | 3/1977 | Crimmins et al. ............ 439/70 |
| 5,679,929 | A | | 10/1997 | Greenfield et al. |
| 5,922,989 | A | * | 7/1999 | Tsunoda et al. ............ 174/52.5 |
| 6,036,504 | A | * | 3/2000 | McHugh et al. ............ 439/660 |
| 6,238,249 | B1 | | 5/2001 | Kuwamura ................. 439/668 |
| 2001/0015373 | A1 | * | 8/2001 | Olson .................... 228/180.22 |

FOREIGN PATENT DOCUMENTS

| JP | 06-140106 | 5/1994 |
| JP | 08-203629 | 8/1996 |

* cited by examiner

Primary Examiner—Chandrika Prasad
(74) Attorney, Agent, or Firm—David G. Conlin; William J. Daley, Jr.; Edwards & Angell, LLP

(57) ABSTRACT

A Jack connector includes: a retainer which holds a semiconductor optical device and an electrical connection terminals; wherein the electrical connection terminals each extend out of the retainer so as to be soldered onto a board; wherein the retainer has recesses provided in a vicinity of the respective terminals so as to accommodate a solder possibly creeping up along the terminals when the jack connector is soldered onto the board.

12 Claims, 4 Drawing Sheets

JACK CONNECTOR RETAINER WITH RECESSES IN VICINITY OF ELECTRICAL TERMINALS AND OPTO-ELECTRICAL JACK CONNECTORS USING SUCH RETAINER

CROSS-REFERENCE TO RELATED APPLICATION

This application is related to Japanese application No. 2000-268842 filed on Sep. 5, 2000, whose priority is claimed under 35 USC § 119, the disclosure of which is incorporated by reference in its entirety.

BACKGROUND OF THE INVENTION

1. Field of the Invention

The present invention relates to a jack connector and, more particularly, to a jack connector for connection between digital audio systems or between a digital audio system and an information system such as a personal computer.

2. Description of the Related Art

A jack connector is conventionally known which comprises a semiconductor optical device to be optically connected to an external optical signal transmission plug for reception and transmission of an optical signal, a plurality of electrical connection terminals to be electrically connected to an external electric signal transmission plug for reception and transmission of an electric signal, and a retainer which holds the semiconductor optical device and the electrical connection terminals, wherein the electrical connection terminals each have a portion extending from the retainer to be connected to external board circuitry (see, for example, Japanese Unexamined Patent Publication No. Hei 6(1994)-140106).

The conventional jack connector selectively receives the optical signal transmission plug and the electric signal transmission plug to serve an optical signal transmitting function as well as an electric signal transmitting function.

When the conventional jack connector is mounted on a board, the electrical connection terminals extending from the retainer are inserted in through-holes formed in the board, and soldered to printed wiring circuitry formed on the back of the board.

Where the conventional jack connector is automatically soldered onto the board with the use of a reflow apparatus, a solder creeps up along the electrical connection terminals through the through-holes of the board, thereby spreading into a space between the board and the bottom surface of the jack connector. In such a case, the electrical connection terminals are shorted with each other, thereby impairing the electric signal transmitting function.

For the mounting of the jack connector on the board, an automatic mounting device is often employed. The mounting device is adapted to hold an upper surface of the jack connector, i.e., an upper surface of the retainer, by suction to automatically transport and mount the jack connector onto the board. Therefore, the upper surface of the retainer of the jack connector is desirably flat so as to be assuredly held by suction.

In view of the foregoing, the present invention is directed to a jack connector which, even if a solder creeps up along terminals thereof when the connector is soldered to be mounted on a board with the use of a reflow apparatus, prevents the solder from spreading into a space between a bottom surface thereof and the board.

The present invention is further directed to a jack connector which can be handled by an automatic mounting device with an upper surface of a retainer thereof being assuredly held by suction for automatic transportation and mounting thereof.

SUMMARY OF THE INVENTION

In accordance with the present invention, there is provided a jack connector adapted to be mounted on a board for selectively receiving an optical signal transmission plug and an electric signal transmission plug for connection thereto, the jack connector comprising: a semiconductor optical device to be optically connected to the optical signal transmission plug for reception and transmission of an optical signal; a plurality of electrical connection terminals to be electrically connected to the electric signal transmission plug for reception and transmission of an electric signal; and a retainer which holds the semiconductor optical device and the electrical connection terminals; wherein the electrical connection terminals each extend out of the retainer so as to be soldered onto the board; wherein the retainer has recesses provided in the vicinity of the respective terminals so as to accommodate a solder possibly creeping up along the terminals when the jack connector is soldered onto the board.

DETAILED DESCRIPTION OF THE INVENTION

Figure 1:
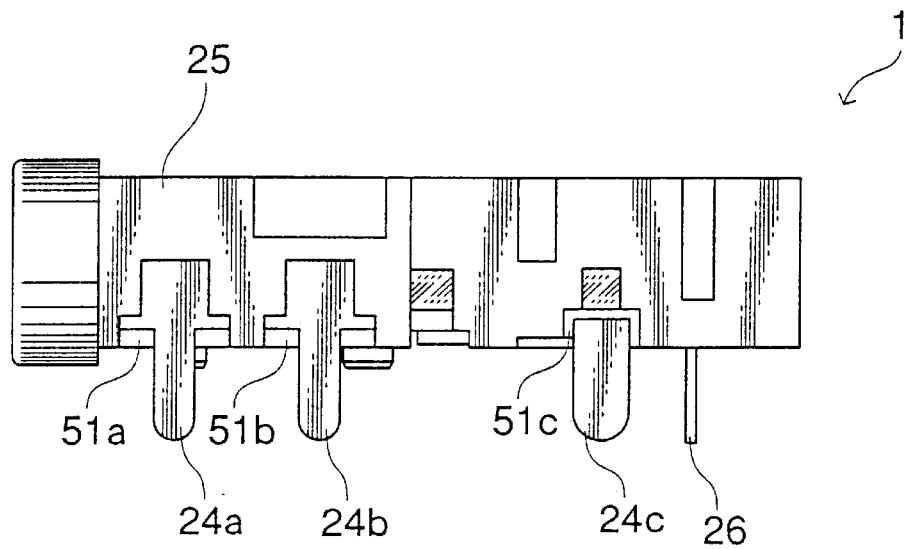
FIG. 1 is a right side view illustrating an opto-electric common jack connector according to Embodiment 1 of the present invention.

In accordance with the present invention, a jack connector adapted to be mounted on a board for selectively receiving an optical signal transmission plug and an electric signal transmission plug for connection thereto comprises: a semiconductor optical device to be optically connected to the optical signal transmission plug for reception and transmission of an optical signal; a plurality of electrical connection terminals to be electrically connected to the electric signal transmission plug for reception and transmission of an electric signal; and a retainer which holds the semiconductor optical device and the electrical connection terminals. The electrical connection terminals each extend out of the retainer so as to be soldered onto the board. The retainer has recesses provided in the vicinity of the respective terminals so as to accommodate a solder possibly creeping up along the terminals when the jack connector is soldered onto the board.

Usable as the optical signal transmission plug in the present invention is, for example, a jack attached to an end of a fiber optic cable and having substantially the same external configuration and size as a common electric signal transmission plug. Usable as the electric signal transmission plug in the present invention is, for example, a stereophonic jack.

The inventive jack connector is typically mounted on the board through a soldering process with the use of a reflow apparatus. More specifically, a solder paste is applied onto predetermined portions of the board, and then the jack connector and like electronic devices are mounted on the board. Subsequently, the resulting board is transported through heating means such as a reflow oven by a conveyor so as to be heated for the soldering.

In the inventive jack connector, the retainer has a lower surface to be brought into contact with the board, and a side surface adjacent to the lower surface, and the recesses are each provided as a cutaway portion extending from the lower surface to the side surface of the retainer. The recesses are not necessarily required to be provided as the cutaway portions, but may have any configuration which allows for accommodation of the molten solder creeping up along the electrical connection terminals.

In the inventive jack connector, at least one of the electrical connection terminals may extend through a recess and be bent in the recess. With the electrical connection terminal bent in the recess, the molten solder creeping up along the terminal is trapped in a bent portion thereof. Therefore, the solder is prevented from creeping further ahead of the bent portion of the electrical connection terminal.

In the inventive jack connector, the recesses each have a volume for accommodating the solder. This is easily achieved where the recesses are each provided as the cutaway portion, whereby the solder creeping up along the electrical connection terminals can effectively be prevented from spreading into a space between the board and a bottom surface of the jack connector.

In the inventive jack connector, the retainer preferably has a flat upper surface opposite from the lower surface which is to be brought into contact with the board.

With this arrangement, an automatic mounting device having a sucking function can assuredly and easily hold the upper surface of the retainer by suction when transporting the jack connector to a predetermined position on the board for the mounting thereof. Therefore, the retainer preferably has no hole in a portion of the upper surface thereof to be held by suction by means of the automatic mounting device.

In accordance with another aspect of the invention, there is provided a jack connector which comprises: a retainer to be mounted on a board for receiving a plug; and a terminal extending out of the retainer so as to be soldered onto the board; wherein the retainer has a solder trap recess for accommodating a solder possibly creeping up along the terminal to the retainer when the terminal is soldered onto the board.

With reference to the attached drawings, the present invention will hereinafter be described in detail by way of embodiments thereof. It should be understood that these embodiments are not limitative of the present invention.

Embodiment 1

Embodiment 1 of the present invention will be described with reference to FIGS. 1 to 6. FIG. 1 is a right side view illustrating an opto-electric common jack connector according to Embodiment 1, and FIG. 2 is a bottom view thereof.

Figure 2:
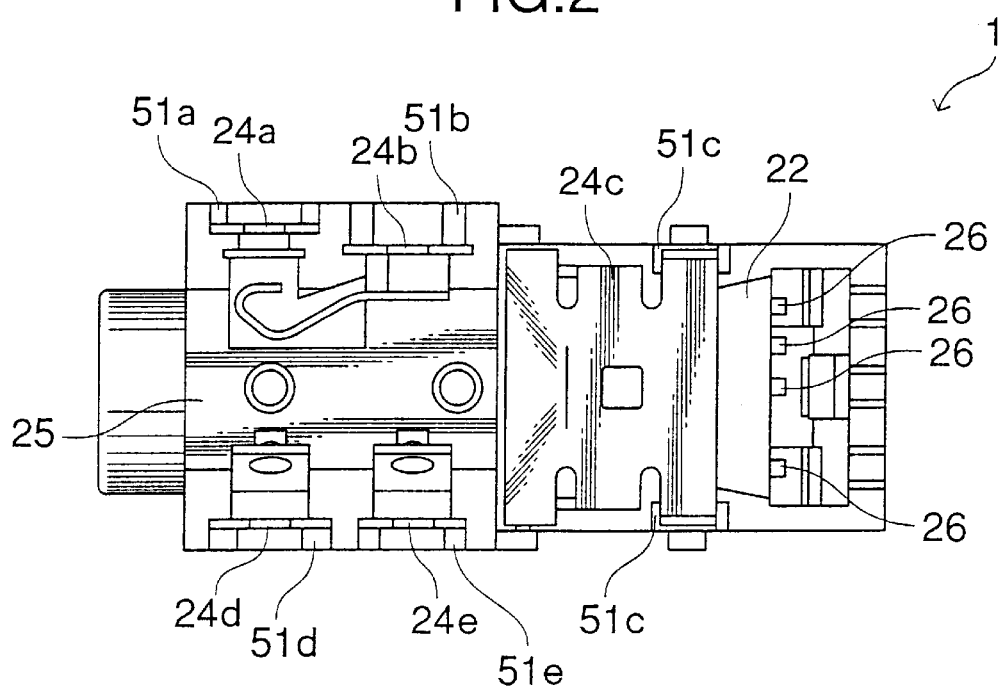
FIG. 2 is a bottom view of the opto-electric common jack connector shown in FIG. 1.
Figure 3:
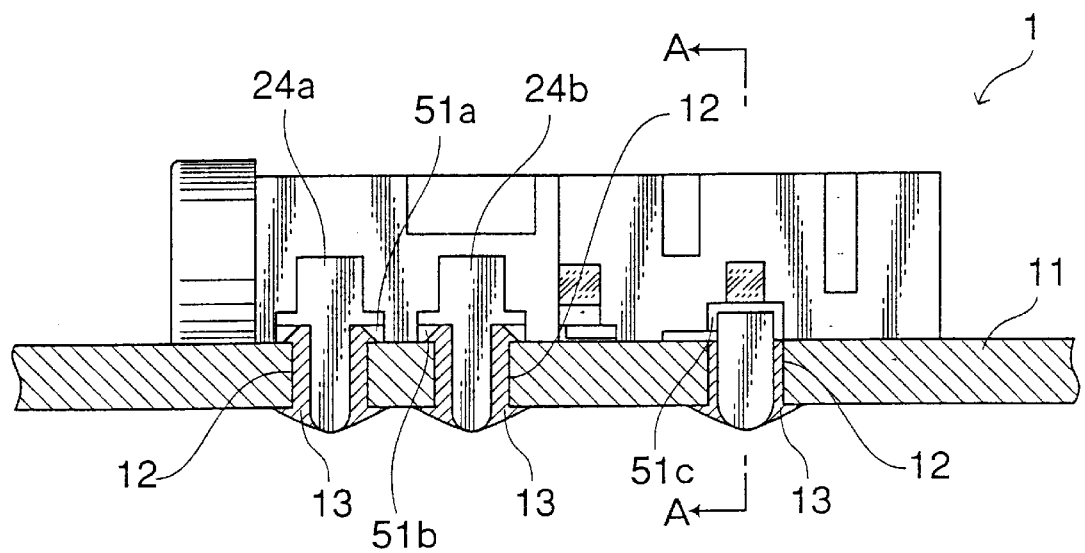
FIG. 3 is a right side view illustrating the opto-electric common jack connector of FIGS. 1 and 2 mounted on a board.
Figure 4:
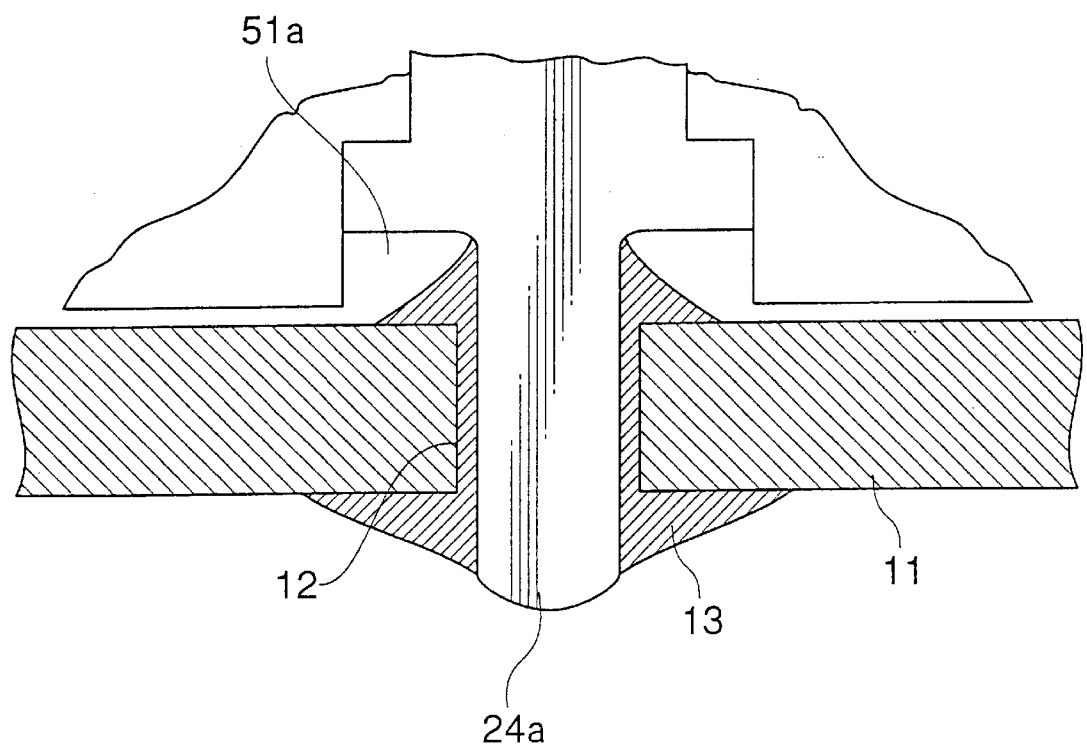
FIG. 4 is a partial enlarged view of FIG. 3.
Figure 5:
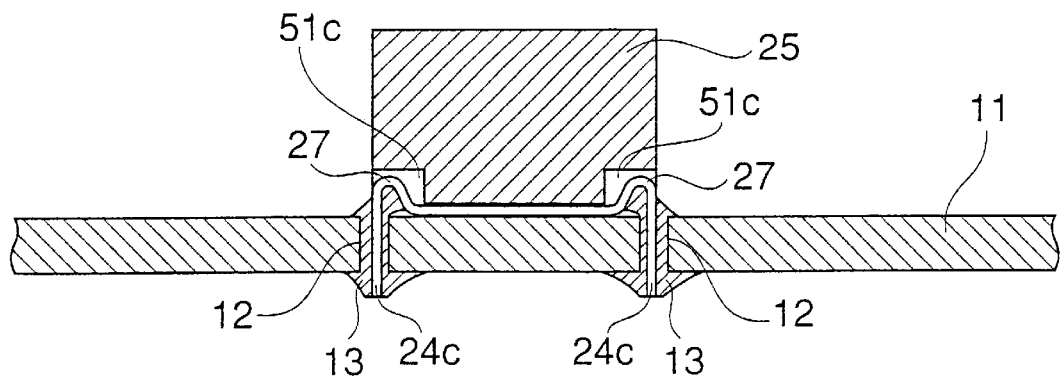
FIG. 5 is a schematic sectional view taken along a line A—A in FIG. 3.
Figure 6:
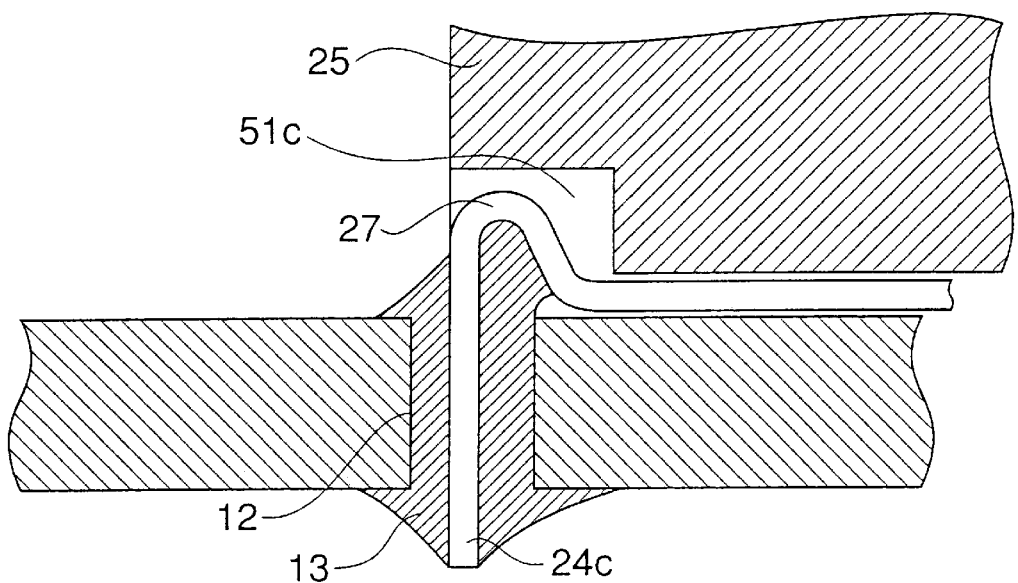
FIG. 6 is a partial enlarged view of FIG. 5.

FIG. 3 is a right side view illustrating the opto-electric common jack connector of FIGS. 1 and 2 mounted on a board, and FIG. 4 is a partial enlarged view of FIG. 3. FIG. 5 is a schematic sectional view taken along a line A—A in FIG. 3, and FIG. 6 is a partial enlarged view of FIG. 5.

As shown in FIGS. 1 and 2, the opto-electric common jack connector 1 according to Embodiment 1 includes a semiconductor optical device 22 to be optically connected to an external optical signal transmission plug (not shown) for reception and transmission of an optical signal, a plurality of electrical connection terminals (terminals) 24a, 24b, 24c, 24d and 24e to be electrically connected to an external electric signal transmission plug (not shown) for reception and transmission of an electric signal, and a retainer 25 which holds the semiconductor optical device 22 and the electrical connection terminals 24a, 24b, 24c, 24d and 24e. The retainer 25 has a plurality of solder trap recesses (recesses) 51a, 51b, 51c, 51d and 51e provided in a surface thereof, and the electrical connection terminals 24a, 24b, 24c, 24d and 24e respectively extend from the solder trap recesses 51a, 51b, 51c, 51d and 51e. These electrical connection terminals are to be soldered onto a board 11 (see FIG. 3).

More specifically, the opto-electric common connector 1 according to Embodiment 1 shown in FIGS. 1 and 2 is selectively connected to the optical signal transmission plug and the electric signal transmission plug, thereby serving an optical signal transmitting function and an electric signal transmitting function.

In the opto-electric common connector 1, the semiconductor optical device 22 is to be optically connected to the optical signal transmission plug for reception and transmission of an optical signal, while the plurality of electrical connection terminals 24a, 24b, 24c, 24d and 24e are to be electrically connected to the electric signal transmission plug for reception and transmission of an electric signal.

The semiconductor optical device 22 is provided with semiconductor optical device terminals 26 for electrical connection between the semiconductor optical device 22 and external circuitry (not shown) provided on the board 11 (see FIG. 3).

The semiconductor optical device 22 and the electrical connection terminals 24a, 24b, 24c, 24d and 24e are held in the retainer 25. The electrical connection terminals 24a, 24b, 24c, 24d and 24e and the semiconductor optical device terminals 26 extend out of the retainer 25 so as to be soldered onto the external circuitry of the board 11 (see FIG. 3). The solder trap recesses 51a, 51b, 51c, 51d and 51e are provided in surface portions of the retainer 25 adjacent to the electrical connection terminals 24a, 24b, 24c, 24d and 24e which are to be brought into contact with the board 11 (see FIG. 3).

When the opto-electric common jack connector 1 is soldered onto the board 11 with the use of a reflow apparatus, a solder 13 creeps up along the electrical connection terminals 24a, 24b through through-holes 12 formed in the board 11, but is trapped in the solder trap recesses 51a, 51b as shown in FIGS. 3 and 4 (the solder creeping up along the electrical connection terminals 24d, 24e are also trapped in the solder trap recesses 51d, 51e, through not shown in FIGS. 3 and 4). Thus, the solder 13 creeping up along the electrical connection terminals 24a, 24b, 24d and 24e is prevented from spreading into a space between the board 11 and the bottom surface (lower surface) of the opto-electric common jack connector 1.

As shown in FIG. 2, the electrical connection terminal 24c covers a major area of the bottom surface of the retainer 25 for enhancement of the strength thereof. Therefore, the electrical connection terminal 24c has bent portions 27 respectively provided in the solder trap recesses 51c, and extends from the bent portions 27 out of the retainer as shown in FIGS. 5 and 6. Thus, the solder 13 creeping up along extensions of the electrical connection terminal 24c is trapped in the bent portions 27 thereby to be prevented from spreading into the space between the board 11 and the bottom surface of the opto-electric common jack connector 1.

Embodiment 2

Figure 7:
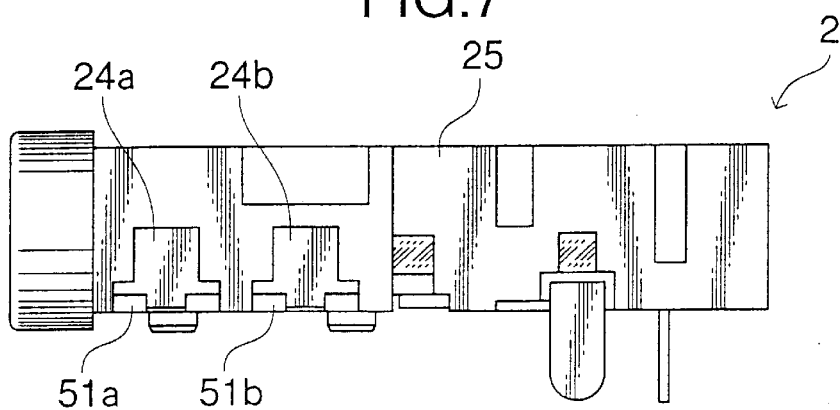
FIG. 7 is a right side view illustrating an opto-electric common jack connector according to Embodiment 2.
Figure 8:
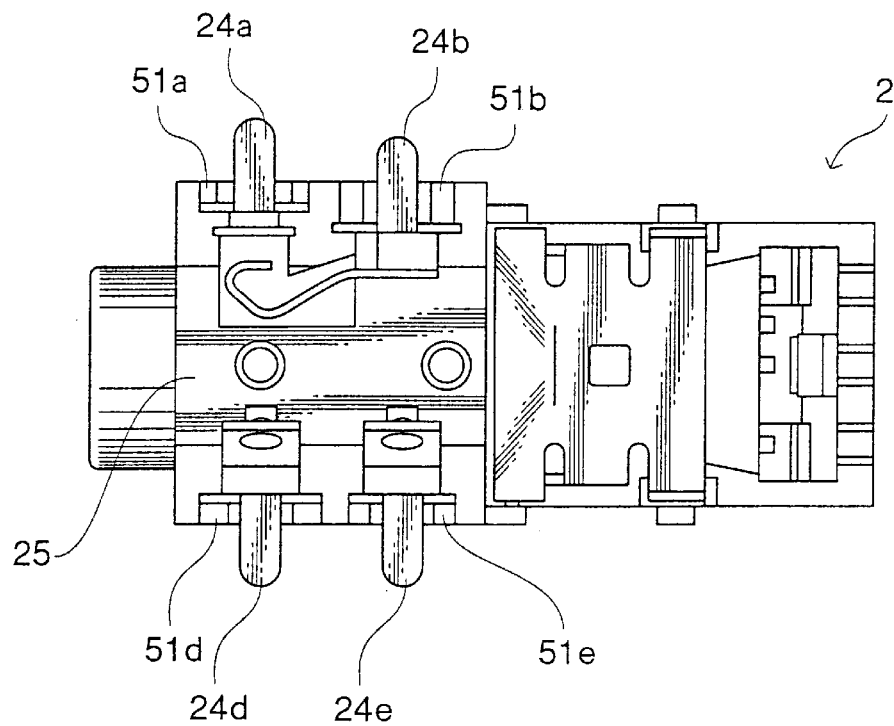
FIG. 8 is a bottom view of the opto-electric common jack connector according to Embodiment 2.

An opto-electric common jack connector according to Embodiment 2 of the present invention will be described with reference to FIGS. 7 and 8. FIG. 7 is a right side view illustrating the opto-electric common jack connector according to Embodiment 2, and FIG. 8 is a bottom view thereof. In FIGS. 7 and 8, components equivalent to those in Embodiment 1 are denoted by the same reference characters as in Embodiment 1.

In the opto-electric common jack connector 2 according to Embodiment 2 shown in FIGS. 7 and 8, electrical connection terminals 24a, 24b, 24d and 24e are each bent perpendicularly on a bottom surface of a retainer 25 to extend parallel to the bottom surface. That is, the electrical connection terminals 24a, 24b, 24d and 24e each have an L-shape. The other construction of the opto-electric common jack connector 2 is the same as in Embodiment 1.

When the opto-electric common jack connector 2 is soldered onto a board with the use of a reflow apparatus, a molten solder creeps up along the electrical connection terminals 24a, 24b, 24d and 24e as in Embodiment 1 (see FIGS. 3 to 6). However, the solder is trapped in solder trap recesses 51a, 51b, 51d and 51e formed in the retainer 25 thereby to be prevented from spreading into a space between the board and the bottom surface of the opto-electric common jack connector 2 as in Embodiment 1.

Embodiment 3

Figure 9:
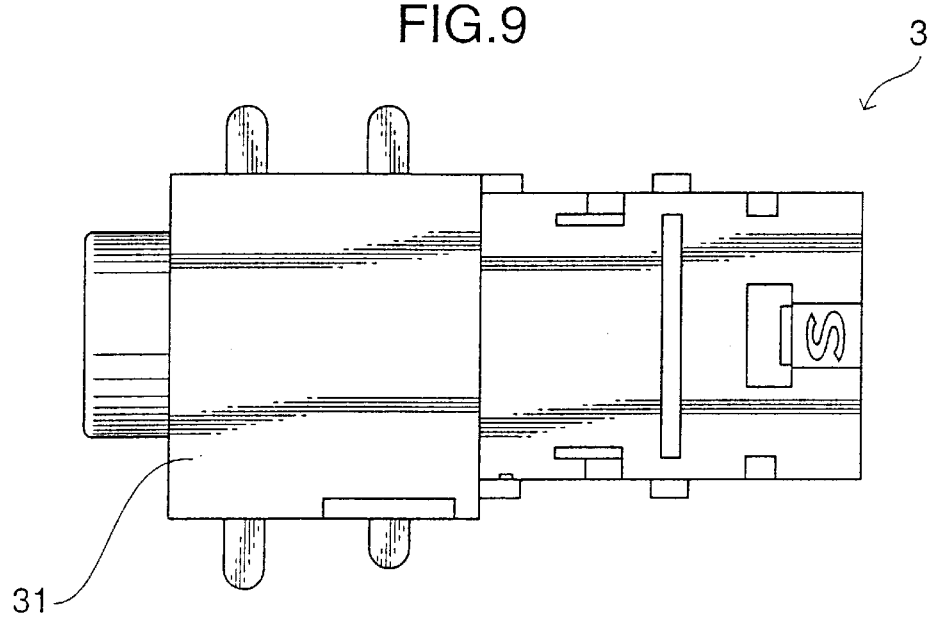
FIG. 9 is a plan view illustrating an opto-electric common jack connector according to Embodiment 3.

An opto-electric common jack connector according to Embodiment 3 of the present invention will be described with reference to FIG. 9. FIG. 9 is a plan view illustrating the opto-electric common jack connector according to Embodiment 3. In FIG. 9, components equivalent to those in Embodiment 1 are denoted by the same reference characters as in Embodiment 1.

In the opto-electric common jack connector 3 according to Embodiment 3 of the invention, a retainer 31 has a flat upper surface (as in Embodiments 1 and 2) which is formed with no hole. The other construction of the opto-electric common jack connector 3 is the same as in Embodiment 1.

Since the upper surface of the retainer 31 is flat and formed with no hole, an automatic mounting device (not shown) having a sucking function can assuredly hold the upper surface of the retainer 31 by suction when transporting the jack connector to a predetermined position on the board for mounting thereof.

In accordance with the present invention, the retainer of the opto-electric common jack connector has the recesses provided in the vicinity of the respective terminals, and the recesses accommodate molten solder possibly creeping up along the terminals during a soldering process. Therefore, a short between the electrical connection terminals can be prevented which may otherwise occur due to intrusion of the solder into the space between the board and the bottom surface of the retainer.

What is claimed is:

1. A jack connector adapted to be mounted on a board for selectively receiving an optical signal transmission plug and an electric signal transmission plug for connection thereto, the jack connector comprising:
    a semiconductor optical device to be optically connected to be optical signal transmission plug for reception and transmission of an optical signal;
    a plurality of electrical connection terminals to be electrically connected to electric signal transmission plug for reception and transmission of an electrical signal;
    a retainer which holds the semiconductor optical device and the electrical connection terminals;
    wherein the electrical connection terminals each extend out of the retainer so as to be soldered upon to the board;
    wherein the retainer includes recesses being arranged such that there is a recess provided in the vicinity of each of the plurality of terminals so as to accommodate a solder possibly creeping up along the terminals when the jack connector is soldered into the board;
    wherein the retainer has a lower surface to be brought into contact with the board, and a side surface adjacent to the lower surface; and
    wherein each of the recesses is provided as a cutaway portion in the retainer, where the cutaway portion extends from a side surface of the recess to the side surface of the retainer.

2. A jack connector as set forth in claim 1, wherein at least one of the electrical connection terminals extends through a corresponding recess and is bent in the recess.

3. A jack connector as set forth in claim 1, wherein the recesses each have a volume for accommodating the solder.

4. A jack connector as set forth in claim 1, wherein the retainer has a flat upper surface opposite from the lower surface thereof which is to be brought into contact with the board.

5. A jack connector as set forth in claim 1, wherein the recesses are arranged in the retainer so as to be separate from each in a direction essentially paralleling a side surface of the retainer.

6. A jack connector as set forth in claim 1, wherein the cutaway portion of each of the recesses are arranged in the retainer so as to be separate from each in a direction essentially paralleling the side surface of the retainer.

7. A jack connector comprising:
    a retainer to be mounted on a board for receiving a plug;
    a plurality of terminals, each extending out of the retainer so as to be soldered onto the board;
    wherein the retainer includes solder trap recesses being arranged such that there is a solder trap recess in the vicinity of each of the plurality of terminals for accommodating a solder possibly creeping up along each terminal to the retainer when the terminals are soldered onto the board;
    wherein the retainer has a lower surface to be brought into contact with the board, and a side surface adjacent to the lower surface; and
    wherein each of the solder trap recesses is provided as a cutaway portion in the retainer, where the cutaway portion extends from a side surface of the recess to the side surface of the retainer.

8. A jack connector as set forth in claim 7, wherein each of the terminals extend through a respective solder trap recess and is bent in the recess.

9. A jack connector as set forth in claim 7, wherein each of the solder trap recesses has a volume for accommodating a solder.

10. A jack connector as set forth in claim 7, wherein the retainer has a flat upper surface opposite from the lower surface thereof which is to be brought into contact with the board.

11. A jack connector as set forth in claim 7, wherein the solder trap recesses are arranged in the retainer so as to be separate from each in a direction essentially paralleling a side surface of the retainer.

12. A jack connector as set forth in claim 7, wherein the cutaway portion of each of the solder trap recesses are arranged in the retainer so as to be separate from each in a direction essentially paralleling the side surface of the retainer.

* * * * *